US010418164B2

(12) United States Patent
Nishikawa et al.

(10) Patent No.: US 10,418,164 B2
(45) Date of Patent: Sep. 17, 2019

(54) COIL COMPONENT, MANUFACTURING METHOD THEREOF, AND CIRCUIT BOARD ON WHICH COIL COMPONENT ARE MOUNTED

(71) Applicant: TDK Corporation, Tokyo (JP)

(72) Inventors: Tomonaga Nishikawa, Tokyo (JP); Tomokazu Ito, Tokyo (JP); Takeshi Okumura, Tokyo (JP); Kouji Kawamura, Tokyo (JP); Tadashi Watanabe, Tokyo (JP); Hidenori Tsutsui, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/291,300

(22) Filed: Oct. 12, 2016

(65) Prior Publication Data

US 2017/0110234 A1 Apr. 20, 2017

(30) Foreign Application Priority Data

Oct. 16, 2015 (JP) .................................. 2015-204337

(51) Int. Cl.
H01F 17/00 (2006.01)
H01F 27/28 (2006.01)
(Continued)

(52) U.S. Cl.
CPC .............. *H01F 27/28* (2013.01); *H01F 3/10* (2013.01); *H01F 17/0013* (2013.01);
(Continued)

(58) Field of Classification Search
CPC .......................... H01F 17/0006; H01F 17/0013
See application file for complete search history.

(56) References Cited

U.S. PATENT DOCUMENTS

2004/0061587 A1* 4/2004 Hong .................. H01F 17/0013
336/200
2013/0222101 A1* 8/2013 Ito .......................... H01F 17/04
336/83
(Continued)

FOREIGN PATENT DOCUMENTS

JP 2013098356 A * 5/2013 ............. H01F 17/00
WO 2012172939 A1 12/2012

OTHER PUBLICATIONS

JP2013098356A, May 2013, Machine Translation.*

*Primary Examiner* — Elvin G Enad
*Assistant Examiner* — Malcolm Barnes
(74) *Attorney, Agent, or Firm* — Young Law Firm, P.C.

(57) ABSTRACT

Disclosed herein is a coil component that includes first and second magnetic members; a coil layer arranged between the first and second magnetic members, the coil layer including a plurality of conductor layers and a plurality of non-magnetic insulating layers, the conductor layers and the non-magnetic insulating layers being alternately laminated, the conductor layers being connected to each other via through holes formed in the non-magnetic insulating layers to form a coil pattern; a first external terminal covering one end of the coil pattern exposed to at least one of side surfaces of the coil layer without covering the first and second magnetic members; and a second external terminal covering other end of the coil pattern exposed to at least one of the side surfaces of the coil layer without covering the first and second magnetic members.

19 Claims, 8 Drawing Sheets

(51) Int. Cl.
*H01F 27/255* (2006.01)
*H01F 27/29* (2006.01)
*H01F 27/32* (2006.01)
*H01F 41/02* (2006.01)
*H01F 41/04* (2006.01)
*H01F 41/10* (2006.01)
*H05K 1/18* (2006.01)
*H01F 3/10* (2006.01)
*H01F 17/04* (2006.01)

(52) U.S. Cl.
CPC ........... *H01F 17/04* (2013.01); *H01F 27/255* (2013.01); *H01F 27/292* (2013.01); *H01F 27/323* (2013.01); *H01F 41/0206* (2013.01); *H01F 41/04* (2013.01); *H01F 41/10* (2013.01); *H05K 1/181* (2013.01); *H05K 2201/1003* (2013.01)

(56) References Cited

U.S. PATENT DOCUMENTS

| | | | |
|---|---|---|---|
| 2013/0229252 A1* | 9/2013 | Nogi | H01F 27/2804 336/192 |
| 2014/0078843 A1 | 3/2014 | Odahara | |
| 2015/0009003 A1* | 1/2015 | Ozawa | H01F 17/0013 336/200 |
| 2015/0137929 A1* | 5/2015 | Park | H01F 17/0013 336/200 |
| 2017/0018351 A1* | 1/2017 | Yatabe | H01F 27/292 |

\* cited by examiner

COIL COMPONENT, MANUFACTURING METHOD THEREOF, AND CIRCUIT BOARD ON WHICH COIL COMPONENT ARE MOUNTED

BACKGROUND OF THE INVENTION

Field of the Invention

The present invention relates to a coil component and a manufacturing method therefor and, more particularly, to a coil component suitably used for a power supply circuit and a manufacturing method therefor. The preset invention further relates to a circuit board on which such a coil component is mounted.

Description of Related Art

In a coil component used in a power supply circuit, a current higher than that in a coil component for signal transmission flows, so that the coil component used in a power supply circuit needs to have a lower DC resistance. To reduce a DC resistance, it is necessary to reduce a coil length and to increase the cross-sectional area of a coil conductor. On the other hand, to ensure a sufficient inductance, it is necessary to increase a coil length and to reduce a coil conductor width so as to form a larger loop. Thus, a trade-off relationship exists between the reduction in the DC resistance and ensuring of the inductance.

Japanese Patent No. 5,668,849 describes a coil component for signal transmission. The coil component described in this document is designed to be used for signal transmission, so that it has a thin coil conductor and is thus not suitable for power supply use. In addition, the coil component described in this document has a structure where a conductive pattern is formed on the surface of a laminated insulating layer, so that it has low connection reliability and is thus not suitable for a power supply circuit in which high current flows.

SUMMARY

An object of the present invention is therefore to provide a coil component capable of reducing a DC resistance while ensuring a sufficient inductance and a manufacturing method therefor. Another object of the present invention is to provide a circuit board on which such a coil component is mounted.

A coil component according to the present invention includes first and second magnetic members, a coil layer sandwiched between the first and second magnetic members, and first and second external terminals. The coil layer includes a plurality of conductor layers and a plurality of non-magnetic insulating layers which are alternately laminated. The conductor layers are connected to each other through through holes formed in the non-magnetic insulating layers to constitute a coil pattern. The first external terminal is provided in such a way that it does not cover the first and second magnetic members but covers one end of the coil pattern exposed to side surfaces of the coil layer. The second external terminal is provided in such a way that it does not cover the first and second magnetic members but covers the other end of the coil pattern exposed to the side surfaces of the coil layer.

Further, a circuit board according to the present invention is a circuit board on which the above-described coil component is mounted. A lamination direction of the coil component is parallel to the mounting surface of the circuit board.

According to the present invention, the plurality of conductor layers are laminated to constitute the coil pattern. Therefore, a DC resistance can be reduced while a sufficient inductance is ensured by increasing the cross-sectional area of the conductor. Further, the insulating layers interposed between the conductor layers are each made of a non-magnetic material, so that a self-resonance frequency of the coil component can be increased. Further, the external terminals are provided at the side surfaces of the coil layer, so that the coil component can be mounted vertically, that is, mounted in such a way that the lamination direction thereof is parallel to the mounting surface of the circuit board. In addition, the configuration where the external terminals do not cover the magnetic members makes the formation of the external terminals easy.

In the present invention, the non-magnetic insulating layers preferably include a first non-magnetic insulating layer provided in contact with the first magnetic member and a second non-magnetic insulating layer provided in contact with the second magnetic member. Preferably, the first external terminal does not cover the first non-magnetic insulating layer exposed to the side surfaces of the coil layer but covers the one end of the coil pattern, and the second external terminal does not cover the second non-magnetic insulating layer exposed to the side surfaces of the coil layer but covers the other end of the coil pattern. With the above configuration, when the external terminals are formed by plating, a phenomenon that the plating is extended to the first and second magnetic members can be prevented.

In the present invention, the conductor layers preferably include a first conductor layer in which the one end of the coil pattern is formed and a second conductor layer in which the other end of the coil pattern is formed, and one or two or more third conductor layer positioned between the first and second conductor layers. The first conductor layer preferably includes a first connection conductor that overlaps the other end of the coil pattern in the lamination direction. The second conductor layer preferably includes a second connection conductor that overlaps the one end of the coil pattern in the lamination direction. The third conductor layer preferably includes a third connection conductor that overlaps the other end of the coil pattern in the lamination direction and a fourth connection conductor that overlaps the one end of the coil pattern in the lamination direction. The one end of the coil pattern is preferably connected to the second and fourth connection conductors through the through holes formed in the non-magnetic insulating layers. The other end of the coil pattern is preferably connected to the first and third connection conductors through the through holes formed in the non-magnetic insulating layers. With the above configuration, a resistance at the end portions of the coil pattern can be reduced.

In this case, the one end of the coil pattern and the second and fourth connection conductors are preferably integrated together, exposed to the side surfaces of the coil layer, and covered by the first external terminal, and the other end of the coil pattern and first and third connection conductors are preferably integrated together, exposed to the side surfaces of the coil layer, and covered by the second external terminal. With the above configuration, a resistance between the external terminals and the coil pattern can be reduced.

In the present invention, the non-magnetic insulation layers each should preferably be larger in the area that overlaps each of the conductor layers in the lamination direction than in the area that does not overlap each of the conductor layers in the lamination direction. With the above configuration, the cross-sectional area of each of the conductors constituting the coil pattern becomes large in a planar direction, making it possible to further reduce a DC resistance.

In the present invention, the coil layer preferably has a thickness in the lamination direction larger than the thickness of each of the first and second magnetic members in the lamination direction. With the above configuration, the cross-sectional area of each of the conductors constituting the coil pattern becomes larger in the lamination direction, making it possible to further reduce a DC resistance. Further, the occupancy area of the vertically mounted coil component on the surface of the circuit board can be reduced.

In the present invention, the first and second magnetic members preferably have substantially the same thickness in the lamination direction. With the above configuration, the coil component mounted on the circuit board hardly falls down. The first and second magnetic members may be made of different magnetic materials. In this case, the second magnetic member may be made of a resin containing a magnetic body.

The coil component according to the present invention preferably further includes a third magnetic member provided so as to penetrate the inner diameter portion of the coil pattern and to magnetically connect the first and second magnetic members. With the above configuration, a magnetic resistance can be further reduced.

In the present invention, when viewed in the lamination direction, the coil layer preferably has a rectangular shape having first to fourth corner portions. The first external terminal is preferably provided at the first corner portion, and the second external terminal is preferably provided at the second corner portion adjacent to the first corner portion. Preferably, the external terminal is not provided at the third and fourth corner portions diagonally opposite to the first and second corner portions. The coil component having the above configuration is suitable for being vertically mounted on the circuit board. In this case, the coil component preferably further includes fourth magnetic members provided at the respective third and fourth corner portions so as to magnetically connect the first and second magnetic members. With the above configuration, a magnetic resistance can be further reduced.

In the present invention, the side surfaces of the coil layer preferably include a first side surface positioned between the first and second corner portions, a second side surface positioned between the first and fourth corner portions, and a third side surface positioned between the second and third corner portions. The first and second external terminals provided at the respective second and third side surfaces each preferably have a larger width in the direction perpendicular to the lamination direction than the width thereof in the lamination direction. With the above configuration, it is possible to ensure a sufficient height of a solder fillet when the coil component is mounted vertically on the circuit board.

In this case, the widths of the first and second external terminals provided at the respective second and third side surfaces in the direction perpendicular to the lamination direction are preferably larger than the widths of the first and second external terminals provided at the first side surface in the direction perpendicular to the lamination direction. In this case as well, it is possible to ensure a sufficient height of a solder fillet when the coil component is mounted vertically on the circuit board.

A coil component manufacturing method according to the present invention includes the steps of: forming a coil layer by alternately laminating, on the surface of a first magnetic member, a plurality of non-magnetic insulating layers each having a through hole at a predetermined position thereof and a plurality of conductor layers each having a conductor pattern of a predetermined shape; forming a second magnetic member on the surface of the coil layer; and forming first and second external terminals that do not cover the first and second magnetic members but cover one end and the other end of the coil pattern exposed to side surfaces of the coil layer. According to the above manufacturing method, the above-described coil component can be obtained.

In the present invention, the step of forming the first and second external terminals is preferably performed by applying barrel plating to the one and the other ends of the coil pattern. With the above method, it is possible to easily form the first and second external terminals without covering the first and second magnetic members with the first and second external terminals.

The coil component manufacturing method according to the present invention preferably further includes a step of forming concave portions through each of which the surface of the first magnetic member is exposed by removing, through through holes formed in the uppermost non-magnetic insulating layer, parts of each of non-magnetic insulating layers lower than the uppermost one. The concave portions are preferably filled with the same material as that of the second magnetic member. With the above method, a magnetic resistance can be further reduced.

The coil component manufacturing method according to the present invention preferably further includes a step of grinding the first magnetic member so as to reduce the thickness of the first magnetic member. With this method, the occupancy area of the vertically mounted coil component on the surface of the circuit board can be reduced.

As described above, according to the present invention, there can be provided a coil component capable of reducing a DC resistance while ensuring a sufficient inductance and a manufacturing method therefor. Further, there can be provided a circuit board on which such a coil component is mounted.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
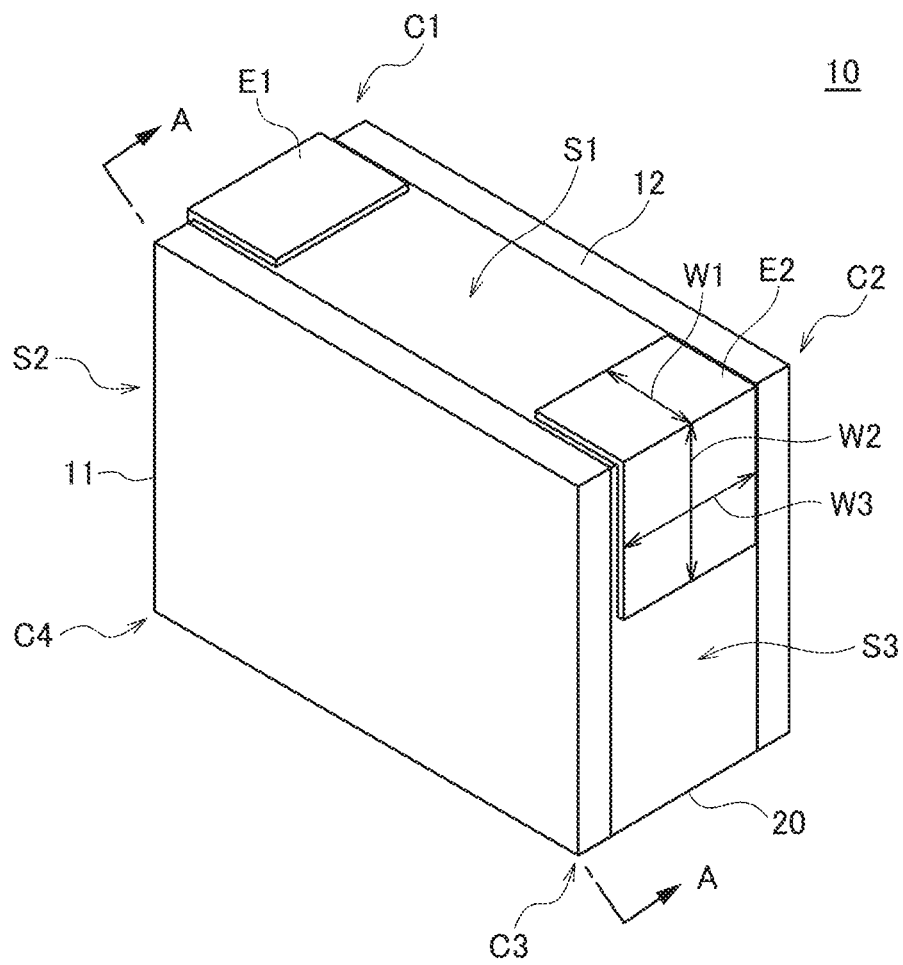
FIG. 1 is a perspective view illustrating an outer appearance of a coil component according to a preferred embodiment of the present invention.
Figure 2:
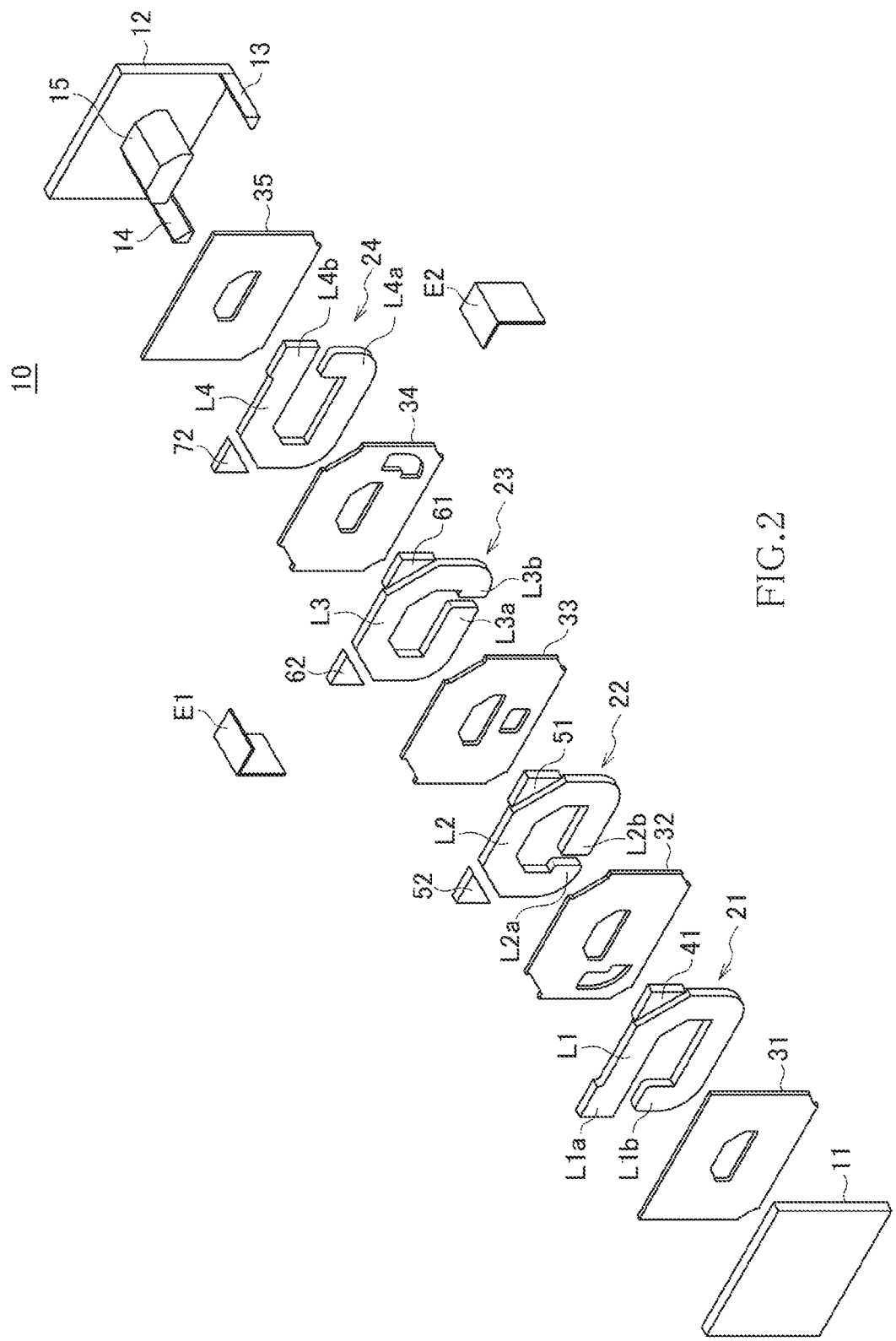
FIG. 2 is an exploded perspective view of the coil component shown in FIG. 1.
Figure 3:
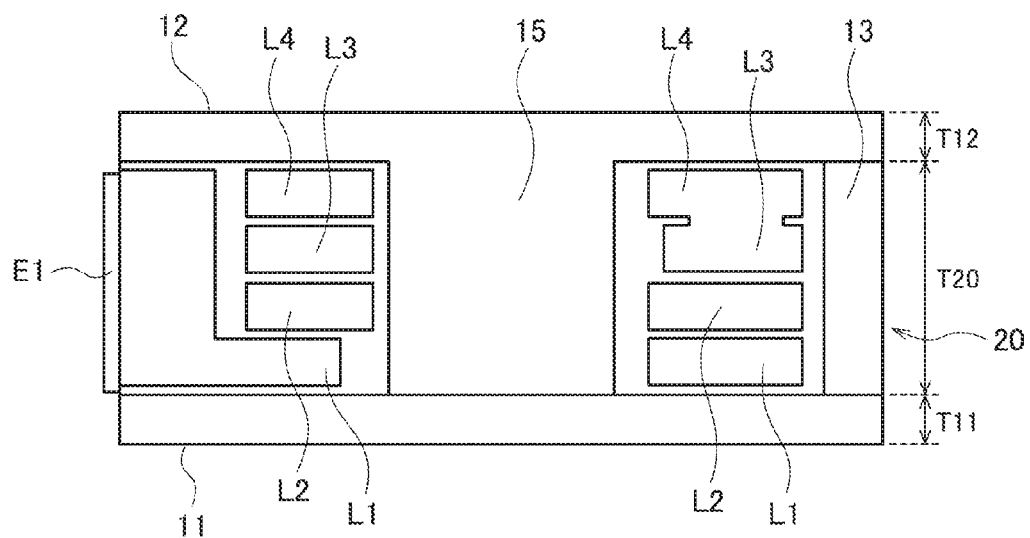
FIG. 3 is a cross-sectional view taken along the line A-A illustrated in FIG. 1.

FIG. 1 is a perspective view illustrating the outer appearance of a coil component 10 according to a preferred embodiment of the present invention. FIG. 2 is an exploded perspective view of the coil component 10. FIG. 3 is a cross-sectional view taken along the line A-A illustrated in FIG. 1.

The coil component 10 according to the present embodiment is a surface-mount type chip component that can be used as an inductor for a power supply circuit. As illustrated in FIGS. 1 to 3, the coil component 10 includes first and second magnetic members 11 and 12 and a coil layer 20 sandwiched between the first and second magnetic members 11 and 12.

The magnetic member 11 is a substrate made of a magnetic material such as a ferrite. As described later, in the manufacturing process of the coil component 10, the magnetic member 11 is used as a substrate, and the coil layer 20 and the magnetic member 12 are formed sequentially on the upper surface of the magnetic member 11. The magnetic member 12 is made of a material different from that of the magnetic member 11 and is a composite material made of a resin containing ferrite powder or metal magnetic powder. As the metal magnetic powder, a permalloy-based material is preferably used. As the resin, a liquid or a powder epoxy resin is preferably used.

In the present embodiment, a thickness T11 of the magnetic member 11 in a lamination direction is almost equal to a thickness T12 of the magnetic member 12 in the lamination direction (T11≈T12). This is because, unlike general coil components, the coil component 10 according to the present embodiment is mounted vertically in such a way that the lamination direction is parallel to the mounting surface of a circuit board. As described later, in the coil component 10 according to the present embodiment, external terminals E1 and E2 are provided only on the side surfaces of the coil layer 20 without covering the magnetic members 11 and 12, so that when the coil component 10 is mounted vertically on the circuit substrate, it is necessary to secure lateral balance, that is, balance between the thickness T11 of the magnetic member 11 and the thickness T12 of the magnetic member 12. However, the thickness T11 of the magnetic member 11 and the thickness T12 of the magnetic member 12 need not be exactly equal to each other, but the above effect can be obtained when they are substantially equal to each other.

Further, in the present embodiment, a thickness T20 of the coil layer 20 in the lamination direction is larger than the thicknesses T11 and T12 of the respective magnetic members 11 and 12 (T11<T20 and T12<T20). By thus increasing the conductor thickness of a coil pattern formed in the coil layer 20, a DC resistance can be reduced. At the same time, the thicknesses T11 and T12 of the respective magnetic members 11 and 12 are made small, so that the occupancy area of the vertically mounted coil component 10 on the surface of the circuit board can be reduced. Further, the external terminals E1 and E2 are provided only on the side surfaces of the coil layer 20, so that the increase in the thickness T20 of the coil layer 20 allows a sufficient area to be ensured for the external terminals E1 and E2.

The coil layer 20 has a configuration in which insulating layers 31 to 35 and conductor layers 21 to 24 are alternately laminated. The conductor layers 21 to 24 are connected to each other through through holes formed in the insulating layers 32 to 34 to thereby form a coil pattern. The insulating layers 31 to 35 are each made of, e.g., a resin, and a non-magnetic material is used at least for the insulating layers 32 to 34. A magnetic material may be used for the lowermost insulating layer 31 and uppermost insulating layer 35.

Unlike general coil components, the coil component 10 according to the present embodiment is very large in the area of a conductor pattern formed in each of the conductor layers 21 to 24. This is for reducing the DC resistance by forming a large area conductor. Although not especially limited, the formation ratio of the conductor pattern to each of the conductor layers 21 to 24 is preferably equal to or higher than 50%. In this case, the area of each of the insulating layers that overlaps the conductor layer in the lamination direction is larger than the area of each of the insulating layers that does not overlap the conductor layer in the lamination direction.

The conductor layer 21 is formed on the upper surface of the magnetic member 11 through the insulating layer 31. The conductor layer 21 has a loop conductor L1 and a connection conductor 41. The loop conductor L1 is an about one-turn conductor wound in the counterclockwise direction (left-hand direction) from one end L1a to the other end L1b when viewed in the lamination direction. The one end L1a of the loop conductor L1 is connected to the external terminal E1. The connection conductor 41 is provided independently of the loop conductor L1.

The conductor layer 22 is formed above the conductor layer 21 through the insulating layer 32. The conductor layer 22 has a loop conductor L2 and connection conductors 51 and 52. The loop conductor L2 is an about one-turn conductor wound in the counterclockwise direction (left-hand direction) from one end L2a to the other end L2b when viewed in the lamination direction. The one end L2a of the loop conductor L2 is connected to the other end L1b of the loop conductor L1 through the through hole formed in the insulating layer 32. The connection conductors 51 and 52 are provided independently of the loop conductor L2.

The conductor layer 23 is formed above the conductor layer 22 through the insulating layer 33. The conductor layer 23 has a loop conductor L3 and connection conductors 61 and 62. The loop conductor L3 is an about one-turn conductor wound in the counterclockwise direction (left-hand direction) from one end L3a to the other end L3b when viewed in the lamination direction. The one end L3a of the loop conductor L3 is connected to the other end L2b of the loop conductor L2 through the through hole formed in the insulating layer 33. The connection conductors 61 and 62 are provided independently of the loop conductor L3.

The conductor layer 24 is formed above the conductor layer 23 through the insulating layer 34. The conductor layer 24 has a loop conductor L4 and a connection conductor 72. The loop conductor L4 is an about one-turn conductor wound in the counterclockwise direction (left-hand direction) from one end L4a to the other end L4b when viewed in the lamination direction. The one end L4a of the loop conductor L4 is connected to the other end L3b of the loop conductor L3 through the through hole formed in the insulating layer 34. The other end L4b of the loop conductor L4 is connected to the external terminal E2. The connection conductor 72 is provided independently of the loop conductor L4.

As a result, an about four-turn coil pattern is constituted by the loop conductors L1 to L4, and the one end L1a and the other end L4b thereof are connected to the external terminals E1 and E2, respectively. The formation ratio of each of the loop conductors L1 to L4 to each of the conductor layers 21 to 24 is preferably equal to or higher than 50%. The loop conductors L1 to L4 and connection conductors 41, 51, 52, 61, 62, and 72 are conductors having high electrical conductivity, such as a copper (Cu), each of which is preferably formed using an electrolytic plating method.

The connection conductors 52, 62, and 72 are provided so as to overlap the one end L1a of the loop conductor L1 in the lamination direction and connected to each other through the through holes formed in the respective insulating layers 32 to 34. The through holes are formed corresponding to a corner portion C1 of the coil layer 20 when viewed in the lamination direction, so that the connection conductors 52, 62, and 72 and the one end L1a of the loop conductor L1a are integrated with each other at the position corresponding to the corner portion C1 of the coil layer 20 without intervention of the insulating layers 32 to 34. The through holes formed in the insulating layers 32 to 34 at the corner portion C1 each have a triangular shape obtained by cutting the corner portion C1. Thus, the one end L1a of the loop conductor L1 and the connection conductors 52, 62, and 72 are integrated with each other at two sides (two side surfaces S1 and S2 forming the corner portion C1) of the coil layer 20 and exposed thereto. The external terminal E1 is provided so as to cover the one end L1a of the loop conductor L1 and connection conductors 52, 62, and 72 exposed to the side surfaces S1 and S2. The external terminal E1 covers only the one end L1a of the loop conductor L1 and the connection conductors 52, 62, and 72 and does not cover other portions, especially, the side surfaces of each of the magnetic members 11 and 12. Further, the external terminal E1 does not cover the lowermost insulating layer 31 and the uppermost insulating layer 35.

The connection conductors 41, 51, and 61 are provided so as to overlap the other end L4b of the loop conductor L4 in the lamination direction and connected to each other through the through holes formed in the respective insulating layers 32 to 34. The through holes are formed corresponding to a corner portion C2 of the coil layer 20 when viewed in the lamination direction, so that the connection conductors 41, 51, and 61 and the other end L4b of the loop conductor L4 are integrated with each other at the position corresponding to the corner portion C2 of the coil layer 20 without intervention of the insulating layers 32 to 34. The through holes formed in the insulating layers 32 to 34 at the corner portion C2 each have a triangular shape obtained by cutting the corner portion C2. Thus, the other end L4b of the loop conductor L4 and the connection conductors 41, 51, and 61 are integrated with each other at two sides (two side surfaces S1 and S3 forming the corner portion C2) of the coil layer 20 and exposed thereto. The external terminal E2 is provided so as to cover the other end L4b of the loop conductor L4 and the connection conductors 41, 51, and 61 exposed to the side surfaces S1 and S3. The external terminal E2 covers only the other end L4b of the loop conductor L4 and the connection conductors 41, 51, and 61 and does not cover other portions, especially, the side surfaces of each of the magnetic members 11 and 12. Further, the external terminal E2 does not cover the lowermost insulating layer 31 and the uppermost insulating layer 35.

The corner portion C1 and the corner portion C2 are adjacent to each other. That is, the coil layer 20 has a rectangular shape when viewed in the lamination direction, and both end portions of one side of the rectangle correspond to the corner portions C1 and C2, respectively. Corner portions C3 and C4 diagonally opposite to the respective corner portions C1 and C2 have no external terminal. This is because, as described later, the coil component 10 according to the present embodiment is mounted vertically on the circuit board.

The upper surface of the conductor layer 24 is covered by the second magnetic member 12 through the insulating layer 35. In each of the insulating layers 31 to 35, through holes are formed so as to correspond respectively to corner portions C3 and C4 of the coil layer 20, and another through hole is formed so as to penetrate an inner diameter portion of the coil pattern. The through holes formed at the respective corner portions C3 and C4 receive fourth magnetic members 13 and 14, respectively. The fourth magnetic members 13 and 14 are made of the same material as that of the magnetic member 12. The through hole penetrating the inner diameter portion of the coil pattern receives a third magnetic member 15 made of the same material as that of the magnetic member 12. The magnetic members 13 to 15 magnetically connect the first magnetic member 11 and the second magnetic member 12 to thereby form a closed magnetic path.

Assuming that the side surface of the coil layer 20 positioned between the corner portion C1 and the corner portion C2 is a first side surface S1, and the side surface positioned between the corner portion C1 and the corner portion C4 is a second side surface S2, the external terminal E1 is formed on the two side surfaces S1 and S2. Further, assuming that the side surface of the coil layer 20 positioned between the corner portion C2 and the corner portion C3 is a third side surface S3, the external terminal E2 is formed on the two side surfaces S1 and S3. Widths W2 of the respective external terminals E1 and E2 illustrated in FIG. 1 are larger than widths W1 thereof (W1<W2) and larger than widths W3 thereof (W2>W3). The widths W1 are the widths of the respective external terminals E1 and E2 formed on the side surface S1 in the direction perpendicular to the lamination direction. The widths W2 are the widths of the respective external terminals E1 and E2 formed on the side surface S2 and S3, respectively, in the direction perpendicular to the lamination direction. The widths W3 are the widths of the respective external terminals E1 and E2 formed on the side surface S2 and S3, respectively, in the lamination direction.

The configuration of the coil component 10 according to the present embodiment has thus been described. With the above configuration, the external terminals E1 and E2 are connected to each other through the coil pattern constituted by the loop conductors L1 to L4. The conductor layers 21 to 24 have the about one-turn loop conductors L1 and L4, so that each conductor layer can ensure a very large conductor width. In addition, when the thickness of each of the conductor layers 21 to 24 is increased, the DC resistance of the coil pattern formed by the loop conductors L1 to L4 can be significantly reduced. Since the number of turns of the coil pattern is determined by the number laminations, it is possible to obtain a larger inductance by increasing the number of laminations.

Figure 4:
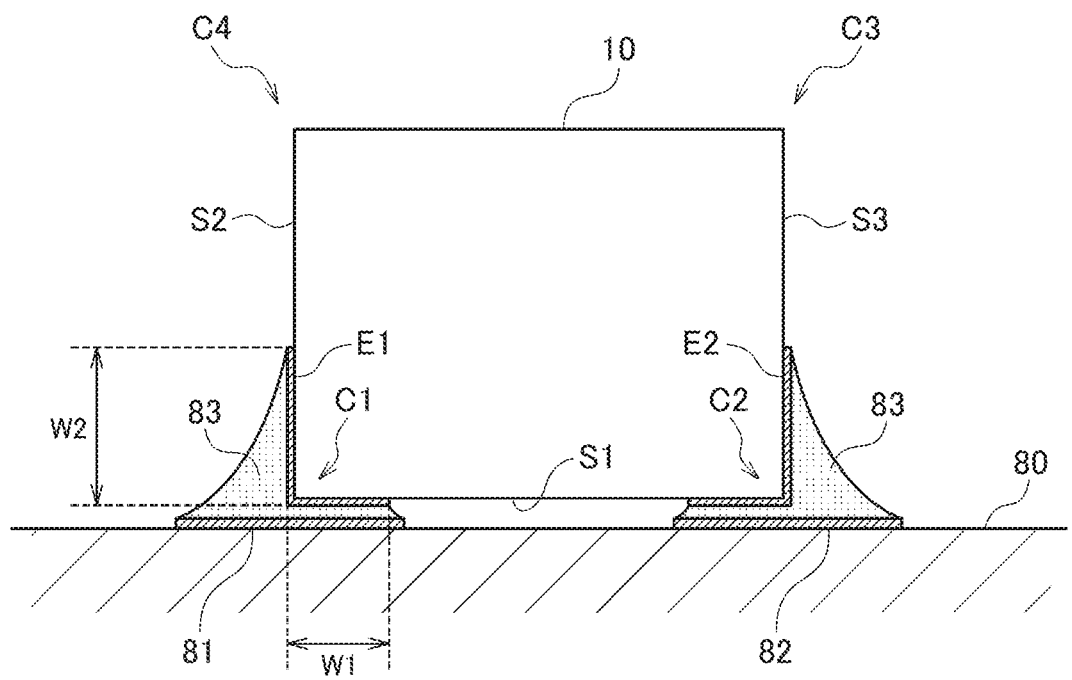
FIG. 4 is a side view illustrating a state where the coil component shown in FIG. 1 is mounted on a circuit board.
Figure 5:
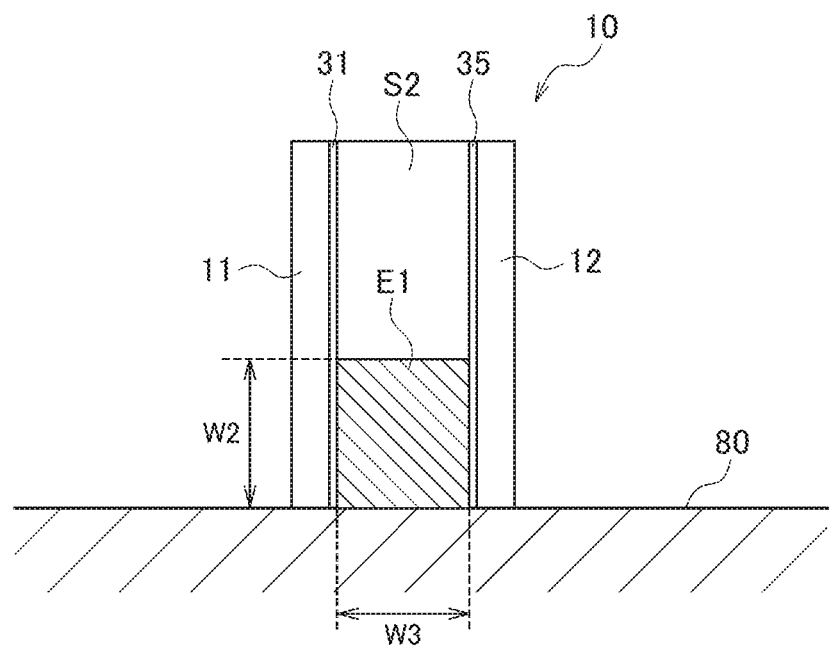
FIG. 5 is another side view of the coil component shown in FIG. 1.

FIG. 4 is a side view (viewed in the lamination direction) illustrating a state where the coil component 10 according to the present embodiment is mounted on a circuit board 80. FIG. 5 is another side view (viewed from the side surface S2 side) of the coil component 10.

As illustrated in FIGS. 4 and 5, the coil component 10 according to the present embodiment is mounted vertically on the circuit board 80. Specifically, the coil component 10 is mounted in such a way that the side surface S1 of the coil layer 20 faces the mounting surface of the circuit board 80, that is, in such a way that the lamination direction of the coil component 10 is parallel to the mounting surface of the circuit board 80. Thus, the occupancy area of the coil component 10 on the mounting surface of the circuit board 80 is a value obtained by adding the areas of the side surfaces of the magnetic members 11 and 12 to the area of the side surface S1 of the coil layer 20. In the coil component 10 according to the present embodiment, the thicknesses T11 and T12 of the respective magnetic members 11 and 12 are each sufficiently smaller than the thickness T20 of the coil layer 20, so that the occupancy area of the coil component 10 on the circuit board 80 can be reduced. In addition, the thickness T11 of the magnetic member 11 and the thickness T12 of the magnetic member 12 are almost equal to each other, so that lateral balance of the coil component 10 in its mounted state can be secured.

As illustrated in FIG. 4, land patterns 81 and 82 are formed on the mounting surface of the circuit board 80, and the external terminals E1 and E2 of the coil component 10 are connected respectively to the land patterns 81 and 82. Electrical/mechanical connection between the land patterns 81, 82 and the external terminals E1, E2 is made by a solder 83. In FIG. 5, the land patterns 81, 82 and the solder 83 are omitted for ease of viewing. A fillet of the solder 83 is formed on a part of the external terminal E1 that is formed on the side surface S2 of the coil layer 20. Similarly, the fillet is formed on a part of the external terminal E2 that is formed on the side surface S3 of the coil layer 20. In the present embodiment, the widths W2 of the respective external terminals E1 and E2 are larger than the widths W1 thereof, so that a sufficiently large fillet can be formed, which can improve mounting reliability.

The following describes a manufacturing method for the coil component 10 according to the present embodiment.

FIGS. 6A to 6I are planar pattern views for explaining a manufacturing process of the coil component 10 according to the present embodiment.

Figure 6A:
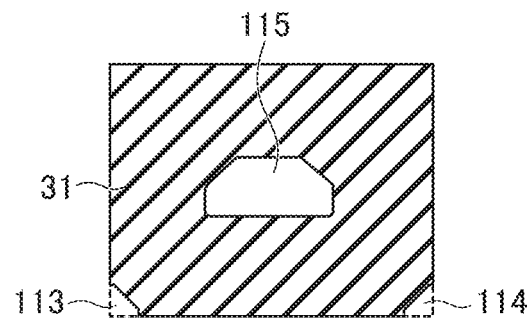
FIGS. 6A to 6I are planar pattern views for explaining a manufacturing process of the coil component shown in FIG. 1.

The magnetic member 11 made of a sintered ferrite having a predetermined thickness is prepared, and the insulating layer 31 is formed on the upper surface of the magnetic member 11 in a pattern illustrated in FIG. 6A. Specifically, a resin material is applied on the upper surface of the magnetic member 11 using a spin coating method, and then a predetermined pattern is formed by a photolithography method. Through holes 113 to 115 illustrated in FIG. 6A are portions that receive the magnetic members 13 to 15 in the following process.

Figure 6B:
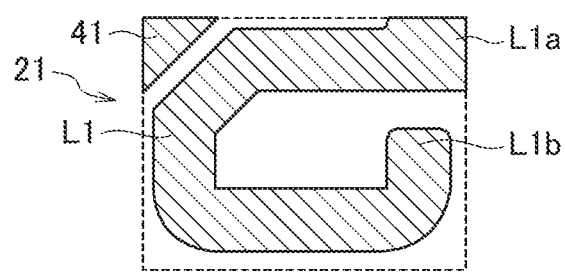

Subsequently, as illustrated in FIG. 6B, the conductor layer 21 is formed on the upper surface of the insulating layer 31. The conductor layer 21 includes the loop conductor L1 and connection conductor 41. A formation method for these conductors preferably includes forming a base metal film using a thin-film forming process such as sputtering and then plating-growing the base metal film to a desired film thickness using an electrolytic plating method.

Figure 6C:
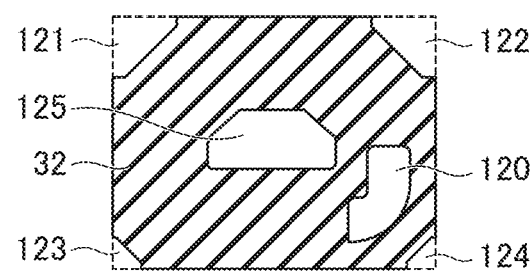

Subsequently, as illustrated in FIG. 6C, the insulating layer 32 is formed on the upper surface of the insulating layer 31 so as to cover the conductor layer 21. A formation method for the insulating layer 32 is the same as that for the insulating layer 31. That is, the resin material is applied using the spin coating method, and then a predetermined pattern is formed by the photolithography method. Through holes 120, 121, and 122 illustrated in FIG. 6C are formed respectively at positions at which the other end L1b of the loop conductor L1, the connection conductor 41, and one end L1a of the loop conductor L1 are exposed. Through holes 123 to 125 are portions that receive the magnetic members 13 to 15 in the following process.

Figure 6D:
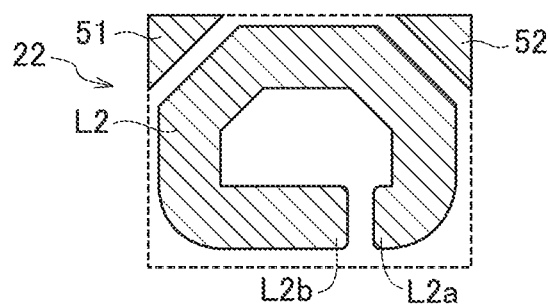

Subsequently, as illustrated in FIG. 6D, the conductor layer 22 is formed on the upper surface of the insulating layer 32. The conductor layer 22 includes the loop conductor L2 and the connection conductors 51 and 52. As a result, the one end L2a of the loop conductor L2 is connected to the other end L1b of the loop conductor L1 through the through hole 120. Further, the connection conductors 51 and 52 are connected respectively to the connection conductor 41 and one end L1a of the loop conductor L1 through the respective through holes 121 and 122. A formation method for the loop conductor L2 and connection conductors 51 and 52 is as described above.

Figure 6E:
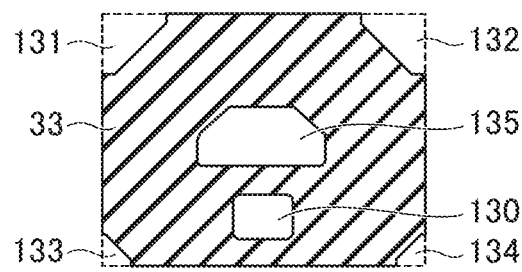

Subsequently, as illustrated in FIG. 6E, the insulating layer 33 is formed on the upper surface of the insulating layer 32 so as to cover the conductor layer 22. A formation method for the insulating layer 33 is the same as that for the insulating layers 31 and 32. Through holes 130, 131, and 132 illustrated in FIG. 6E are formed respectively at positions at which the other end L2b of the loop conductor L2 and the connection conductors 51 and 52 are exposed. Through holes 133 to 135 are portions that receive the magnetic members 13 to 15 in the following process.

Figure 6F:
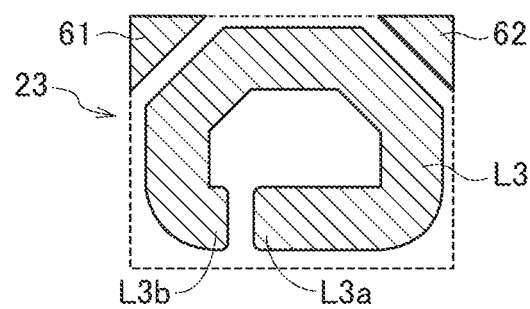

Subsequently, as illustrated in FIG. 6F, the conductor layer 23 is formed on the upper surface of the insulating layer 33. The conductor layer 23 includes the loop conductor L3 and the connection conductors 61 and 62. As a result, the one end L1a of the loop conductor L3 is connected to the other end L2b of the loop conductor L2 through the through hole 130. Further, the connection conductors 61 and 62 are connected respectively to the connection conductors 51 and 52 through the respective through holes 131 and 132. A formation method for the loop conductor L3 and connection conductors 61 and 62 is as described above.

Figure 6G:
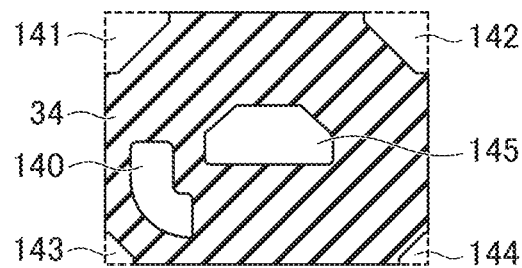

Subsequently, as illustrated in FIG. 6G, the insulating layer 34 is formed on the upper surface of the insulating layer 33 so as to cover the conductor layer 23. A formation method for the insulating layer 34 is the same as that for the insulating layers 31 to 33. Through holes 140, 141, and 142 illustrated in FIG. 6G are formed respectively at positions at which the other end L3b of the loop conductor L3 and the connection conductors 61 and 62 are exposed. Through holes 143 to 145 are portions that receive the magnetic members 13 to 15 in the following process.

Figure 6H:
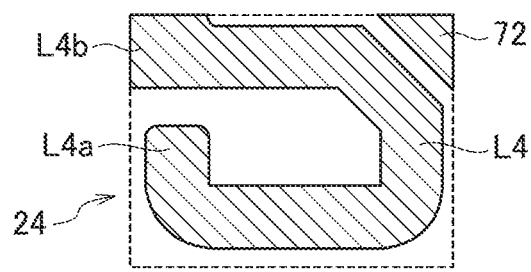

Subsequently, as illustrated in FIG. 6H, the conductor layer 24 is formed on the upper surface of the insulating layer 34. The conductor layer 24 includes the loop conductor L4 and the connection conductor 72. As a result, the one end L4a of the loop conductor L4 is connected to the other end L3b of the loop conductor L3 through the through hole 140. Further, the other end L4b of the loop conductor L4 is connected to the connection conductor 61 through the through hole 141, and the connection conductor 72 is connected to the connection conductor 62 through the through hole 142. A formation method for the loop conductor L4 and the connection conductor 72 is as described above.

Figure 6I:
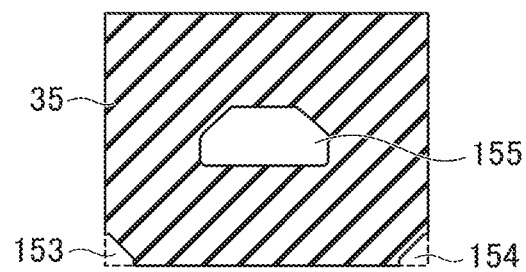

Subsequently, as illustrated in FIG. 6I, the insulating layer 35 is formed on the upper surface of the insulating layer 34 so as to cover the conductor layer 24. A formation method for the insulating layer 35 is the same as that for the insulating layers 31 to 34. Through holes 153 to 155 illustrated in FIG. 6I are portions that receive the magnetic members 13 to 15 in the following process.

In this state, a photolithography method is used to form a predetermined pattern with respect to the through holes 153 to 155, followed by ion-milling, whereby the corresponding portions in each of the insulating layers 31 to 35 are removed. As a result, concave portions through which the magnetic member 11 is exposed are formed at the removed portions.

Subsequently, a resin containing a magnetic body is formed on the entire surface of the insulating layer 35. As a result, the magnetic-material-containing resin is filled in the concave portions, whereby the magnetic members 13 to 15 are formed and, at the same time, the magnetic member 12 that covers the upper surface of the insulating layer 35 is formed.

Figure 7:
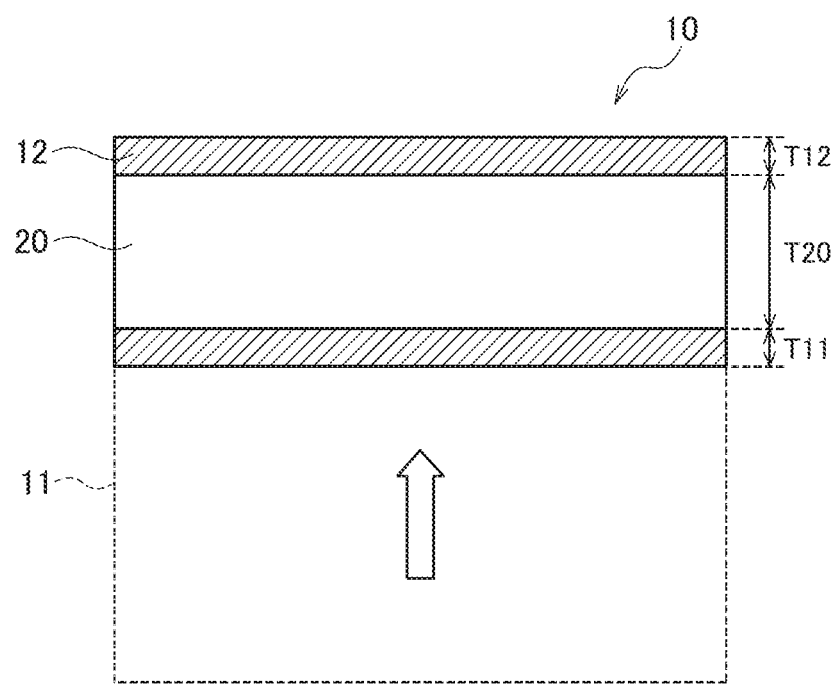
FIG. 7 is a schematic diagram for explaining a grinding process of a magnetic member.

Then, as illustrated in FIG. 7, the magnetic member 11 which is a base plate is ground from the back surface thereof to reduce the thickness T11. As described above, the thickness T11 of the magnetic member 11 is preferably smaller than the thickness T20 of the coil layer 20 and almost equal to the thickness T12 of the magnetic member 12.

Finally, barrel plating is performed. As a result, the external terminal E1 is formed on the surfaces of the one end L1a of the loop conductor L1 and connection conductors 52, 62, and 72 which are exposed to the side surfaces S1 and S2 of the coil layer 20, and the external terminal E2 is formed on the surface of the other end L4b of the loop conductor L4 and the surfaces of the connection conductors 41, 51, and 61 which are exposed to the side surfaces S1 and S3 of the coil layer 20. In this state, the lowermost insulating layer 31 and the uppermost insulating layer 35 are interposed between the conductors exposed to the side surfaces of the coil layer and the magnetic member 11 and between the exposed conductors and the magnetic member 12. Thus, as illustrated in FIG. 5, the insulating layers 31 and 35 each function as a barrier that prevents extension of the plating to the magnetic members 11 and 12. This prevents the plating from extending to the magnetic members 11 and 12, thereby preventing defects in the shape of the terminal.

With the above manufacturing process, the coil component 10 according to the present embodiment is completed.

As described above, the coil component 10 according to the present embodiment has a structure suitable for being mounted vertically on the circuit board 80. This allows the coil pattern to be formed by a thick loop conductor having a large conductor thickness, so that it is possible to reduce a DC resistance while ensuring a sufficient inductance. In addition, the insulating layers 32 to 34 sandwiched by the conductor layers 21 to 24 are each made of a non-magnetic material, so that a high self-resonance frequency can be obtained. This allows reduction in an AC resistance in a switching frequency (e.g., 100 MHz) of a power supply circuit.

Further, the surfaces of the one end L1a of the loop conductor L1 and the connection conductors 52, 62, and 72 are integrated (without intervention of the insulating layers 32 to 34) at the side surfaces S1 and S2 of the coil layer 20, and the external terminal E1 is formed on the surfaces thereof. Similarly, the surfaces of the other end L4b of the loop conductor L4 and the connection conductors 41, 51, and 61 are integrated (without intervention of the insulating layers 32 to 34) at the side surfaces S1 and S3 of the coil layer 20, and the external terminal E2 is formed on the surfaces thereof. Thus, it is possible to significantly reduce a resistance at a connection portion between the external terminals E1, E2 and the coil pattern.

Further, the external terminal E1 is formed only on the surfaces of the one end L1a of the loop conductor L1 and the connection conductors 52, 62, and 72, and the external terminal E2 is formed only on the surfaces of the other end L4b of the loop conductor L4 and the connection conductors 41, 51, and 61, so that the external terminals E1 and E2 can be easily formed by barrel plating. In addition, the thickness T20 of the coil layer 20 is large, thus sufficiently ensuring the areas of the external terminals E1 and E2. On the other hand, the thicknesses T11 and T12 of the respective magnetic members 11 and 12 are small, thus reducing the occupancy area of the vertically mounted coil component 10 on the surface of the circuit board 80. Further, the thicknesses T11 and T12 of the respective magnetic members 11 and 12 are almost equal to each other, so that lateral balance of the coil component 10 can be secured in the vertically mounted state. This prevents the coil component 10 from falling down on the circuit board 80.

It is apparent that the present invention is not limited to the above embodiments, but may be modified and changed without departing from the scope and spirit of the invention.

What is claimed is:

1. A coil component comprising:
   first and second magnetic members;
   a coil layer arranged between the first and second magnetic members, the coil layer including a plurality of conductor layers and a plurality of non-magnetic insulating layers, the conductor layers and the non-magnetic insulating layers being alternately laminated, the conductor layers being connected to each other via through holes formed in the non-magnetic insulating layers to form a coil pattern;
   a first external terminal covering one end of the coil pattern exposed to at least one of side surfaces of the coil layer without covering the first and second magnetic members; and
   a second external terminal covering other end of the coil pattern exposed to at least one of the side surfaces of the coil layer without covering the first and second magnetic members,
   wherein the conductor layers include:
      a first conductor layer having the one end of the coil pattern and a first connection conductor that overlaps the other end of the coil pattern in a lamination direction;
      a second conductor layer having the other end of the coil pattern and a second connection conductor that overlaps the one end of the coil pattern in the lamination direction; and
      one or more third conductor layer positioned between the first and second conductor layers, the third conductor layer having a third connection conductor that overlaps the other end of the coil pattern in the lamination direction and a fourth connection conductor that overlaps the one end of the coil pattern in the lamination direction,
   wherein the one end of the coil pattern is connected to the second and fourth connection conductors via through holes formed in the non-magnetic insulating layers, and
   wherein the other end of the coil pattern is connected to the first and third connection conductors via through holes formed in the non-magnetic insulating layers.

2. The coil component as claimed in claim 1,
   wherein the non-magnetic insulating layers include a first non-magnetic insulating layer provided in contact with the first magnetic member and a second non-magnetic insulating layer provided in contact with the second magnetic member,
   wherein the first external terminal covers the one end of the coil pattern without covering the first and second non-magnetic insulating layers exposed to the side surfaces of the coil layer, and wherein the second external terminal covers the other end of the coil pattern without covering the first and second non-magnetic insulating layers exposed to the side surfaces of the coil layer.

3. The coil component as claimed in claim 1, wherein the one end of the coil pattern and the second and fourth connection conductors are integrated together, exposed to at least one of the side surfaces of the coil layer and covered by the first external terminal, and wherein the other end of the coil pattern and first and third connection conductors are integrated together, exposed to at least one of the side surfaces of the coil layer, and covered by the second external terminal.

4. The coil component as claimed in claim 1, wherein each of the non-magnetic insulation layers is larger in an area that overlaps with the conductor layers in a lamination direction than in an area that does not overlap with the conductor layers in the lamination direction.

5. The coil component as claimed in claim 1, wherein the coil layer has a thickness in a lamination direction larger than a thickness of each of the first and second magnetic members in the lamination direction.

6. The coil component as claimed in claim 1, wherein the first and second magnetic members have substantially a same thickness in a lamination direction.

7. The coil component as claimed in claim 1, wherein the first and second magnetic members are made of different magnetic materials.

8. The coil component as claimed in claim 1, further comprising a third magnetic member provided so as to penetrate an inner diameter portion of the coil pattern and to magnetically connect the first and second magnetic members.

9. The coil component as claimed in claim 1, wherein the coil layer has a rectangular shape having first to fourth corner portions when viewed in a lamination direction, wherein the first external terminal is provided at the first corner portion, and the second external terminal is provided at the second corner portion adjacent to the first corner portion, and wherein the third and fourth corner portions each diagonally opposite to the first and second corner portions are free from an external terminal.

10. The coil component as claimed in claim 9, further comprising fourth magnetic members provided at the third and fourth corner portions so as to magnetically connect the first and second magnetic members.

11. The coil component as claimed in claim 9, wherein the side surfaces of the coil layer include:
a first side surface positioned between the first and second corner portions;
a second side surface positioned between the first and fourth corner portions; and
a third side surface positioned between the second and third corner portions, and
wherein the first and second external terminals provided at the second and third side surfaces each have a larger width in a direction perpendicular to the lamination direction than a width thereof in the lamination direction.

12. The coil component as claimed in claim 11, wherein the widths of the first and second external terminals provided at the second and third side surfaces in a direction perpendicular to the lamination direction are larger than widths of the first and second external terminals provided at the first side surface in the direction perpendicular to the lamination direction.

13. A device comprising:
a circuit board having a mounting surface; and
a coil component mounted the mounting surface of on the circuit board, the coil component includes:
first and second magnetic members;
a coil layer arranged between the first and second magnetic members, the coil layer including a plurality of conductor layers and a plurality of non-magnetic insulating layers, the conductor layers and the non-magnetic insulating layers being alternately laminated, the conductor layers being connected to each other via through holes formed in the non-magnetic insulating layers to form a coil pattern;
a first external terminal covering one end of the coil pattern exposed to at least one of side surfaces of the coil layer without covering the first and second magnetic members; and
a second external terminal covering other end of the coil pattern exposed to at least one of the side surfaces of the coil layer without covering the first and second magnetic members,
wherein a lamination direction of the coil component is parallel to the mounting surface of the circuit board,
wherein the conductor layers include:
a first conductor layer having the one end of the coil pattern and a first connection conductor that overlaps the other end of the coil pattern in a lamination direction;
a second conductor layer having the other end of the coil pattern and a second connection conductor that overlaps the one end of the coil pattern in the lamination direction; and
one or more third conductor layer positioned between the first and second conductor layers, the third conductor layer having a third connection conductor that overlaps the other end of the coil pattern in the lamination direction and a fourth connection conductor that overlaps the one end of the coil pattern in the lamination direction,
wherein the one end of the coil pattern is connected to the second and fourth connection conductors via through holes formed in the non-magnetic insulating layers, and
wherein the other end of the coil pattern is connected to the first and third connection conductors via through holes formed in the non-magnetic insulating layers.

14. The coil component as claimed in claim 1, wherein the first and second magnetic members are entirely exposed without being covered with the first and second external terminals.

15. A coil component comprising:
a plurality of insulating layers including first, second, and two or more third insulating layers; and
a plurality of conductor layers including first, second, and one or more third conductor layers,
wherein the insulating layers and the conductor layers are alternately stacked such that the third conductor layer is sandwiched between adjacent two of the third insulating layers, that the first conductor layer is sandwiched between a lowermost one of the third insulating layers and the first insulating layer, and that the second conductor layer is sandwiched between an uppermost one of the third insulating layers and the second insulating layer, wherein the first conductor layer includes a first coil pattern and a first connection conductor, wherein the second conductor layer includes a second coil pattern and a second connection conductor, wherein the third conductor layer includes a third coil pattern and third and fourth connection conductors, wherein the first, second, and third coil patterns are connected through openings formed on the third insulating layers, wherein each of the first, second, and third insulating layers has a rectangular shape having first to fourth corners when viewed in a staking direction, wherein each of the third insulating layers has a first cutout at the first corner and a second cutout at the second corner, wherein the first coil pattern, the second connection conductor, and the third connection conductor are connected to one another through the first cutouts, and wherein the second coil pattern, the first connection conductor, and the fourth connection conductor are connected to one another through the second cutouts.

16. The coil component as claimed in claim 15, further comprising first, second, third, and fourth magnetic members, wherein the insulating layers and the conductor layers are sandwiched between the first and second magnetic members, wherein the third and fourth magnetic members are connected between the first and second magnetic members, wherein each of the first, second, and third insulating layers has a third cutout at the third corner and a fourth cutout at the fourth corner, wherein the third magnetic member is arranged at the third cutouts, and wherein the fourth magnetic member is arranged at the fourth cutouts.

17. The coil component as claimed in claim 16, wherein the third corner is diagonally opposite to the first corner, and wherein the fourth corner is diagonally opposite to the second corner.

18. The coil component as claimed in claim 17, further comprising:

a first external terminal connected to the first coil pattern, the second connection conductor, and the third connection conductor; and a second external terminal connected to the second coil pattern, the first connection conductor, and the fourth connection conductor.

19. The coil component as claimed in claim 18, wherein each of the first and second external terminals cover the third insulating layers without covering the first and second insulating layers and the first and second magnetic members.

* * * * *